United States Patent
Seo et al.

(10) Patent No.: US 7,898,168 B2
(45) Date of Patent: Mar. 1, 2011

(54) ORGANIC ELECTROLUMINESCENT DEVICE HAVING LIGHT-EMITTING LAYER WITH GUEST DOPANT

(75) Inventors: Satoshi Seo, Kanagawa (JP); Hiroko Abe, Tokyo (JP); Hisao Ikeda, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 97 days.

(21) Appl. No.: 10/967,267

(22) Filed: Oct. 19, 2004

(65) Prior Publication Data

US 2005/0088083 A1 Apr. 28, 2005

(30) Foreign Application Priority Data

Oct. 27, 2003 (JP) .................................. 2003-366707

(51) Int. Cl.
*H05B 33/00* (2006.01)
(52) U.S. Cl. ......... 313/504; 313/506; 428/690; 428/917; 257/79
(58) Field of Classification Search ........... 313/504–512
See application file for complete search history.

(56) References Cited

U.S. PATENT DOCUMENTS

| | | | |
|---|---|---|---|
| 4,769,292 A | | 9/1988 | Tang et al. |
| 5,317,169 A | * | 5/1994 | Nakano et al. ............. 257/40 |
| 5,747,183 A | * | 5/1998 | Shi et al. ................ 428/690 |
| 5,766,779 A | * | 6/1998 | Shi et al. ................ 428/690 |
| 5,904,994 A | * | 5/1999 | Dodabalapur et al. ........ 428/690 |
| 6,210,814 B1 | * | 4/2001 | Thompson et al. ........... 428/690 |
| 6,387,546 B1 | * | 5/2002 | Hamada et al. ............. 428/690 |
| 6,392,250 B1 | * | 5/2002 | Aziz et al. ............... 257/40 |
| 6,432,560 B1 | * | 8/2002 | Verhoeven et al. .......... 428/690 |
| 6,455,579 B1 | * | 9/2002 | Satsuki et al. ............. 514/457 |
| 6,803,720 B2 | * | 10/2004 | Kwong et al. ............. 313/504 |
| 6,835,474 B2 | * | 12/2004 | Okada et al. .............. 428/690 |
| 6,953,628 B2 | | 10/2005 | Kamatani et al. |
| 7,094,477 B2 | | 8/2006 | Kamatani et al. |
| 7,147,935 B2 | | 12/2006 | Kamatani et al. |
| 7,507,485 B2 | | 3/2009 | Oh et al. |

(Continued)

FOREIGN PATENT DOCUMENTS

EP 1 220 340 A2 7/2002

(Continued)

OTHER PUBLICATIONS

Y. Sato, "Problem for Implementation in view of Materials Development", The Japan Society of Applied Physics/Organic Molecular Electronics and Bioelectronics, vol. 1, No. 1 (2000), pp. 86-99. (Concise Statement).

(Continued)

*Primary Examiner* — Sikha Roy
(74) *Attorney, Agent, or Firm* — Nixon Peabody LLP; Jeffrey L. Costellia (57) ABSTRACT

A light-emitting element is disclosed with a light-emitting layer containing a host material added with a small amount of guest material, wherein color purity can be improved as well as reduced a driving voltage. Color purity can be improved as well as reduced a driving voltage especially in a light-emitting element added with a red light-emitting material as a guest material. A light-emitting layer is disclosed that includes a first host material, which is an organic compound having a hole transporting property; a second host material, which is an organic compound having a larger dipole moment than that of the first host material; and a guest material having an electron-withdrawing group.

25 Claims, 9 Drawing Sheets

U.S. PATENT DOCUMENTS

| | | | |
|---|---|---|---|
| 7,527,879 B2 | 5/2009 | Kamatani et al. | |
| 7,544,426 B2 | 6/2009 | Kamatani et al. | |
| 7,572,522 B2 | 8/2009 | Seo et al. | |
| 7,579,089 B2 | 8/2009 | Seo et al. | |
| 7,687,155 B2 | 3/2010 | Kamatani et al. | |
| 2002/0101154 A1* | 8/2002 | Seo et al. | 313/506 |
| 2002/0105005 A1 | 8/2002 | Seo et al. | |
| 2003/0175630 A1* | 9/2003 | Yamashita et al. | 430/619 |
| 2003/0184217 A1* | 10/2003 | Yamazaki et al. | 313/505 |
| 2003/0197466 A1* | 10/2003 | Yamazaki et al. | 313/504 |
| 2003/0214006 A1* | 11/2003 | Nakamura et al. | 257/448 |
| 2004/0072017 A1* | 4/2004 | Nii et al. | 428/690 |
| 2004/0144974 A1* | 7/2004 | Lee et al. | 257/40 |
| 2005/0048317 A1* | 3/2005 | Seo et al. | 428/690 |
| 2005/0230665 A1* | 10/2005 | Thompson | 252/500 |
| 2006/0228583 A1 | 10/2006 | Kamatani et al. | |
| 2006/0243970 A1 | 11/2006 | Seo et al. | |
| 2006/0257687 A1* | 11/2006 | Hosokawa et al. | 428/690 |
| 2009/0184634 A1 | 7/2009 | Kamatani et al. | |
| 2009/0273280 A1 | 11/2009 | Seo et al. | |

FOREIGN PATENT DOCUMENTS

| | | |
|---|---|---|
| EP | 1 317 005 A2 | 6/2003 |
| EP | 1 348 711 A1 | 10/2003 |
| EP | 1 349 435 A1 | 10/2003 |
| EP | 1 881 050 A2 | 1/2008 |
| EP | 1 889 891 A2 | 2/2008 |
| JP | 28114435 | 8/1998 |
| JP | 2814435 | 10/1998 |
| JP | 2001-284061 | 10/2001 |
| JP | 2002-313583 | 10/2002 |
| JP | 2003-142269 | 5/2003 |
| WO | WO 02/44189 A1 | 6/2002 |

OTHER PUBLICATIONS

C.H. Chen et al., "Improved Red Dopants for Organic Electroluminescent Devices", Macromol. Symp. 125, pp. 49-58 (1997).

Yuji Hamada et al., "Red organic light-emitting diodes using an emitting assist dopant", Applied Physics Letters, vol. 75, No. 12, pp. 1682-1684.

T.K. Hatwar et al., "Red Emitting Organic Electroluminescent Devices with Improved Stability", The 10th International Workshop on Inorganic and Organic Electroluminescence (EL'00), pp. 31-34.

Y. Sato, "Problem for Implementation in view of Materiels Development". The Japan Society of Applied Physics/Organic Molecular Electronics and Bioelectronics, vol. 11, No. 1, (2000), pp. 86-99. (Concise Statement).

* cited by examiner

ORGANIC ELECTROLUMINESCENT DEVICE HAVING LIGHT-EMITTING LAYER WITH GUEST DOPANT

BACKGROUND OF THE INVENTION

1. Field of the Invention

The present invention relates to a light-emitting element comprising an anode, a cathode, and a layer containing an organic compound (hereinafter, electroluminescent layer) that emits light upon being applied with an electric field, and more particularly such a light-emitting element that exhibits red emission. Also, the present inventions relate to a light-emitting device using the light-emitting element and an electric appliance using the light-emitting device.

2. Related Art

As a light-emitting element containing organic compounds as a light emitter, a light-emitting element that emits light by applying an electric field to pass an electric current across the light-emitting element is known. It is the emission mechanism that voltage is applied to an electroluminescent layer interposed between a pair of electrodes, and electrons injected from a cathode and holes injected from an anode are recombined each other within the electroluminescent layer to produce excited molecules (hereinafter, molecular exciton), then, the molecular exciton radiates energy as light while returning to the ground state. The excited states are known as a singlet excited state and a triplet excited state. It is considered that light emission can be obtained through either the excited states.

In such the light-emitting element, an electroluminescent layer is generally formed to have a thin film thickness of from approximately 100 to 200 nm. A light-emitting element does not require backlight, which is used for the conventional liquid crystal display device, since an electroluminescent layer emits light itself, that is, the light-emitting element is a self-luminous device. Therefore, it is highly advantageous that a light-emitting element can be manufactured into an extreme thin film and to be lightweight.

For example, in an electroluminescent layer having a thickness of approximately 100 nm, the time for the process of from the injection to the recombination of carriers takes approximately several ten nanoseconds in the light of the carrier mobility. Hence, the time required for the process of from the injection of carriers to the light emission of the electroluminescent layer is on the order of microsecond even if the process of the recombination of carriers is included therein. Thus, an extreme high response speed is also one of the advantages of a light-emitting element.

A light-emitting element containing organic compounds as a light emitter is a carrier injecting type device. Consequently, a light-emitting element is not required to be applied with a high alternating voltage as in the case with an inorganic electroluminescent element. A light-emitting element can be driven at a low direct-current voltage of from approximately several to ten several volts.

As noted above, a light-emitting element containing organic compounds as a light emitter has characteristics of thin and lightweight, high response speed, low direct-current voltage drive, and the like, and is attracted attention as a next generation's flat panel display device. Especially, a light-emitting device including such light-emitting elements arranged in a matrix configuration has superiority over the conventional liquid crystal display device in a wide viewing angle and high visibility.

In case that such light-emitting elements are utilized for a flat panel display or the like, emission color of light obtained from the light-emitting elements is required to be controlled to have desired color. As a method for controlling emission color of the light-emitting element, a method that a light-emitting layer is formed by a host material added with a small amount of guest material (also referred to as a dopant material) to obtain desired emission color derived from the guest material (hereinafter, doping system) is frequently used in recent years. (For example, see JP Patent 2,814,435.)

The doping system as typified by the foregoing JP Patent 2,814,435 can prevent concentration quenching of light-emitting molecules to obtain high luminance and high efficiency. Accordingly, the doping system is an effective method for emitting red emission material that is susceptible to be concentration quenched. For example, C. H. Chen et al. is disclosed that they synthesized red emission materials such as various 4-dicyanomethylene-4H-pyrane derivatives to use as a guest material in Macromolecular Symposia, No. 125, 49-58 (1997).

However, most light-emitting elements applied with such a doping system have a disadvantage that driving voltage is increased. Especially, it is known that a light-emitting element added with a red emission material as a guest material has a strong tendency to increase driving voltage. (For example, see Yoshiharu SATO, "The Japan Society of Applied Physics/Organic Molecular Electronics and Bioelectronics", vol. 11, No. 1 (2000), 86-99).

Within a light-emitting element manufactured by a doping system, not only a guest material, but also a host material emits light, and so light emission from the device cannot be well controlled. As a result, color purity of the light emission may be deteriorated. The phenomenon is occurred when there is a large difference between excited energy of the host material and that of the guest material, and is common in a light-emitting element added with a red emission material as a guest material. It is considered that the phenomenon may be prevented by adding assist dopant having excited energy lying between the host material and the guest material. (For example, see Yuji HAMADA et al., Applied Physics Letters, Vol. 75, No. 12, 1682-1684 (1999).) It has been reported that the lifetime of a light-emitting element is improved by adding assist dopant and by doping materials that enable trapping holes. (For example, see T. K. Hatwar et al., Proceedings of the 10th International Workshop on Inorganic and Organic Electroluminescence (EL'00), 31-34.)

According to the method disclosed by Yuji HAMADA et al. and T. K. Hatwar et al, a driving voltage can not be reduced whereas luminescence with good color purity can be obtained.

A problem has arisen that a driving voltage is increased or color purity is deteriorated without controlling emission color in a light-emitting element manufactured by a doping system. It has been expected to solve the foregoing problems.

SUMMARY OF THE INVENTION

In view of the foregoing, it is an object of the present invention to reduce a driving voltage in a light-emitting element manufactured by a doping system. It is more specific object of the invention to reduce a driving voltage in a light-emitting element added with a red emission material as a guest material.

Further, it is another object of the present invention to improve color purity as well as to reduce a driving voltage. It is more specific another object of the invention to improve color purity as well as to reduce a driving voltage in a light-emitting element added with a red emission material as a guest material.

The inventors focused on the fact that a driving voltage of a light-emitting element including 4-dicyanomethylene-4H-pyran derivatives as a guest material is especially larger than that of a light-emitting element without being added with a guest material. They thought that the increase in driving voltage is caused by an electron-withdrawing group in the 4-dicyanomethylene-4H-pyran derivatives.

Based on the consideration, the inventors found out after their keen examination that a driving voltage can be reduced by forming a light-emitting element added with a guest material having an electron-withdrawing group to have the following structure.

According to one aspect of the present invention, a light-emitting element is provided with a light-emitting layer containing a first host material that is an organic compound having a hole transporting property, a second host material having a larger dipole moment than that of the first host material, and a guest material having an electron-withdrawing group.

Further, the first and the second host materials preferably have carrier transportation properties within a light-emitting layer. The guest material having an electron-withdrawing group preferably serves as a light emitter.

In accordance with the foregoing aspect of the present invention, the first host material accounts for 20% or more to 60% or less of total weight of the first host material that is an organic compound having a hole transportation property, the second host material that is an organic compound having a larger dipole moment than that of the first host material, and the guest material having an electron-withdrawing group. Preferably, the first host material accounts for 30% or more to 50%.

In accordance with the foregoing aspect of the present invention, the guest material having an electron-withdrawing group accounts for 5% or less of total weight of the first host material that is an organic compound having a hole transportation property, the second host material that is an organic compound having a larger dipole moment than that of the first host material, and the guest material having an electron-withdrawing group.

In accordance with the foregoing aspect of the present invention, in addition to the host material and the guest material, the light-emitting layer may contain an assist dopant material that prevents the host material from emitting light.

The foregoing aspect of the present invention is effective for a guest material having various electron-withdrawing groups, especially, a guest material introduced with a cyano group, a halogeno group (halogen group), or carbonyl group. For example, the foregoing embodiment is effective for a guest material having a skeleton including dicyanomethylene group such as 4-dicyanomethylene-4H-pyran skeleton.

Any organic compound can be used as the first host material as long as it has a hole transporting property. Especially, an organic compound having an aromatic amine skeleton is preferably used.

The inventors found out that a peak wavelength of an emission spectrum of a light-emitting element is varied depending on a dipole moment of molecules of a host material in case that a light-emitting layer is formed by the host material added with a guest material having an electron-withdrawing group. Specifically, the dipole moment of molecules of the host material becomes smaller; the peak wavelength of an emission spectrum is shifted to a shorter wavelength side. Therefore, in case that a host material having a small dipole moment is used to manufacture a red light-emitting element by using a guest material that has an electron-withdrawing group and that can exhibit red emission, the red light-emitting element may emit orange or yellow emission. Accordingly, such the host material may unsuitable for the red light-emitting element.

In the present invention, the second host material has preferably 4 debye or more in the foregoing light-emitting element. From the viewpoint of a large dipole moment, metal complexes are preferably used as the second host material.

Most guest materials having an electron-withdrawing group emit light in a region of from yellow to red by the effect of the substituent. Especially, an emission spectrum of the foregoing guest material has a peak at in a range between 560 nm to 700 nm according to the present invention.

The foregoing light-emitting element operates at low driving voltage and emits light with good color purity by using the first host material that is an organic compound having a hole transportation property, and the second host material that is an organic compound having a larger dipole moment than that of the first host material. Accordingly, a light-emitting device that consumes less power and that emits light with good color purity can be manufactured by using the foregoing light-emitting element. Therefore, the light-emitting device having the light-emitting element according to the present invention is within the scope of the present invention.

As used herein, the term "light-emitting device" refers to an image display device or a light-emitting device including a light-emitting element. Further, the light-emitting device also refers to a substrate provided with a thin film transistor and a light-emitting element; a module in which the substrate attached with a connector such as an anisotropic conductive film, TAB (Tape Automated Bonding) tape, or a TCP (Tape Carrier Package); a module in which the top of the TAB tape or the TCP is provided with a printed wiring board; or a module in which the substrate is directly installed with an IC (Integrated Circuit) by COG (Chip On Glass).

Therefore, a driving voltage can be reduced as well as improved color purity in a light-emitting element manufactured by a doping system to have a light-emitting layer formed by a first host material that is an organic compound having a hole transportation property, and a second host material that is an organic compound having a larger dipole moment than that of the first host material. Color purity can be improved as well as reduced a driving voltage especially in a light-emitting element added with a red light-emitting material as a guest material.

These and other objects, features and advantages of the present invention will become more apparent upon reading of the following detailed description along with the accompanied drawings.

DESCRIPTION OF THE INVENTION

Figure 1A:
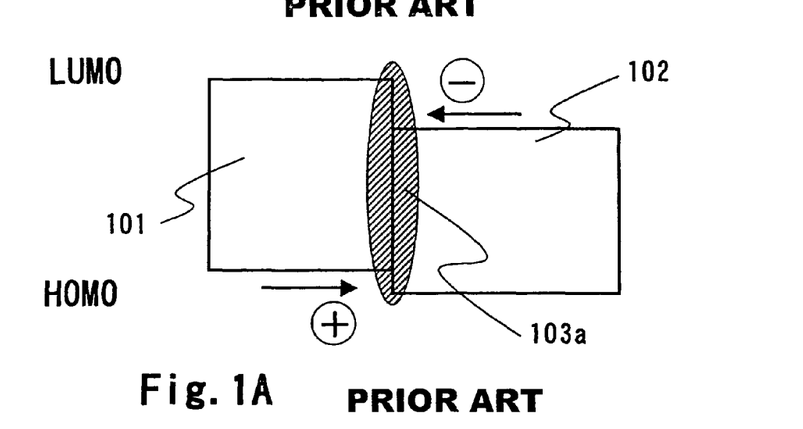
FIGS. 1A to 1C are band diagrams for showing the conventional light-emitting element.

FIG. 1A is a band diagram for the lamination structure often used for an light-emitting element, that is, a lamination structure formed by stacking a hole transporting layer and an electron transporting layer. As shown in FIG. 1A, since holes are transported smoothly along with HOMO level of a hole transporting material in a hole transporting layer 101 and electrons are transported smoothly along with LUMO level of an electron transporting material in an electron transporting layer 102, respectively, a recombination region of these carriers is located at the vicinity of an interface between the hole transporting layer 101 and the electron transporting layer 102.

Figure 1B:
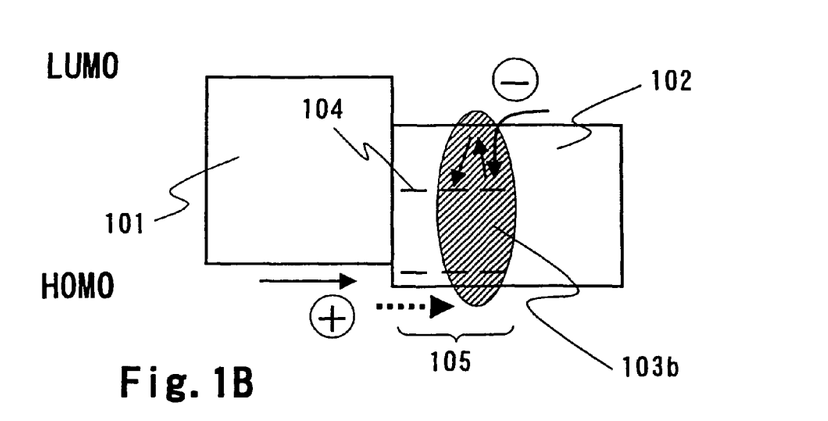

Conventionally, based on the structure illustrated in FIG. 1A, a guest material having an electron-withdrawing group is added to the electron transporting layer 102. FIG. 1B is a band diagram for the foregoing structure. The guest material having an electron-withdrawing group has extreme large electron affinity due to the effects of the strong electron-withdrawing property, consequently, LUMO level 104 is located at a low position to form an extreme deep electron trap level.

In this case, electrons are difficult to transfer in a region 105 doped with a guest material having an electron-withdrawing group due to the deep electron trap level, it may be expected that a carrier recombination region 103b is away from the vicinity of an interface in a lamination structure to spread toward an electron transporting layer 102. Accordingly, the inventors thought that an electron transporting layer formed by an electron transporting material is required to transport holes (as indicated by dotted arrow in the diagram), as a result, current becomes difficult to flow, and voltage for light emission caused by recombination of carriers (that is, a driving voltage) is increased.

Figure 1C:
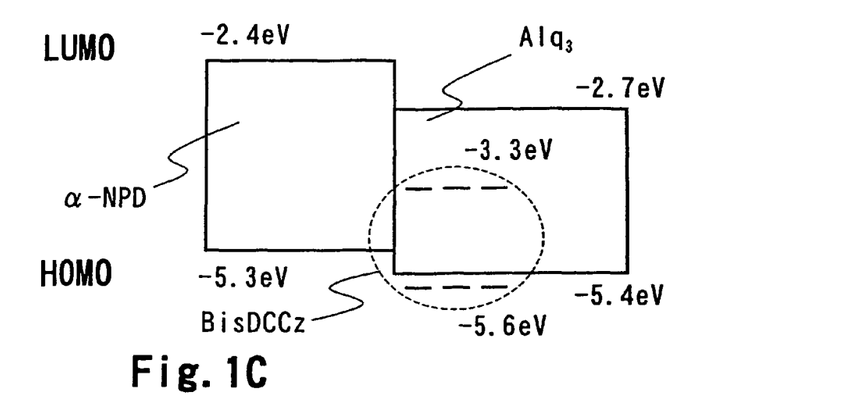

In fact, the band diagram illustrated in FIG. 1C is formed in the case that 4,4'-bis[N-(1-naphtyl)-N-phenyl-amino]-biphenyl (abbreviated α-NPD) is used as a hole transporting material for a hole transporting layer; tris(8-quinolinolato)aluminum (abbreviated $Alq_3$) is used as an electron transporting material for an electron transporting layer; and 4-dicyanomethylene-2,6-bis[p-(N-carbazolyl)styryl]-4H-pyran (abbreviated BisDCCz) is used as a guest material having a cyano group that is an electron-withdrawing group. Accordingly, the increase of a driving voltage increased derived from an extreme deep electron trap level (−3.3 eV) is expected.

The value of the HOMO level (a negative value, its absolute value corresponds to ionization potential) illustrated in FIG. 1C is calculated in accordance with the following procedure, that is, the value of ionization potential of each material in a thin film form is measured by photoelectron spectrometer (AC-2) (RIKEN KEIKI Co., Ltd.), and the measured value is converted into a negative value. The value of the LUMO level is calculated in accordance with the following procedure, that is, an absorption spectrum of each material in a thin film state is measured by UV/VIS spectrometer (JASCO International Co., Ltd.), and the value of an energy gap is evaluated by its absorption edge, then, the evaluated value is added to the value of the HOMO level.

Figure 2:
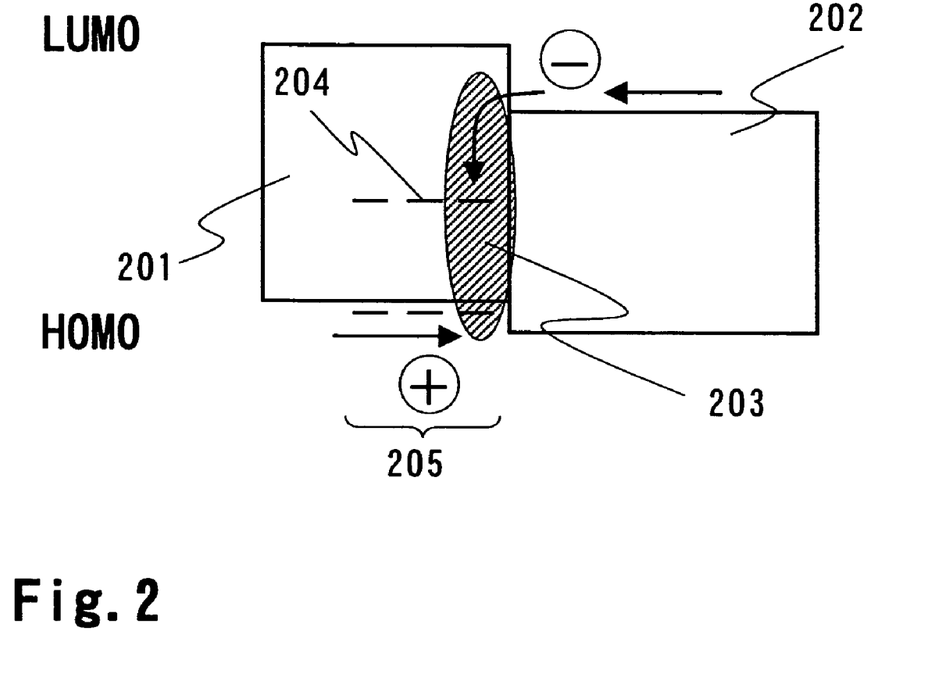
FIG. 2 is a band diagram for showing a light-emitting element according to the present invention.

To avoid the foregoing phenomenon, a hole transporting layer is added with a guest material having an electron-withdrawing group to form a light-emitting layer. FIG. 2 is a band diagram for the foregoing structure. Reference numeral 201 denotes a hole transporting layer; 202, an electron transporting layer; and 205, a region where the hole transporting layer is added with a guest material having an electron-withdrawing group, that is, a light-emitting layer.

In the structure shown in FIG. 2, electrons are passed through the electron transporting layer 202 to be trapped by LUMO level 204 of the guest material at a vicinity of an interface 203 located in the light-emitting layer 205 between the electron transporting layer 202 and the light-emitting layer 205. However, on the contrary to the case shown in FIG. 1, the transportation of holes is easy in the case of this structure since a host material in the light-emitting layer 205 is a hole transporting material used for the hole transporting layer 201. That is, it can be considered that the recombination of carriers becomes easy since holes are easily transported to the vicinity of interface 203 despite that electrons are trapped in the vicinity of interface 203. As a result, current becomes easily flowed and driving voltage can be more reduced compared with the case shown in FIG. 1.

However, it is difficult to obtain emission with good color purity (especially red emission with good color purity) according to the above described configuration. This arises from the fact that emission is shifted to a short wavelength side when a host material having a small dipole moment is used in the case that a light-emitting layer is formed by a host material added with a red emission guest material having an electron-withdrawing group for manufacturing a red light-emitting device compared with the case that the red light-emitting device is formed by a host material having a large dipole moment. In certain instances, red emission with good color purity cannot be achieved. This phenomenon can be considered as a type of solvent effect.

$Alq_3$ used conventionally as a host material has two kinds of constitutional isomers. Generally, the constitutional isomer is referred to as a fac-isomer. The dipole moment of the fac-isomer was 9.398 debye calculated by commercially available molecular orbital calculation software, WinMOPAC3.5 (FUJITSU LIMITED). (In addition, the dipole moment of a mer-isomer that is another constitutional isomer is 5.788 debye.) It has been proved that the device formed by $Alq_3$ used as a host material added with a red emission guest material having an electron-withdrawing group exhibits better red emission as emission color than that of a device formed by a host material having a further small dipole moment (specifically, less than 4 debye) by way of experiment during the process of the present invention.

As discussed above, the size of a dipole moment is an important factor for exhibiting red emission with good color purity. However, a driving voltage of a light-emitting element is increased in case that $Alq_3$ is used as a host material. A hole transporting material having a large dipole moment is extremely desired. However, the kind of such material is limited in the present circumstances. It is not realistic to require such material.

Therefore, the inventors used an organic compound having a hole transportation property as a first host material to reduce a driving voltage, and an organic compound having a large dipole moment as a second host material to keep color purity. Accordingly, a driving voltage can be reduced with keeping good color purity.

As used herein, the term "guest material" refers to a material that exhibits desired emission in a light-emitting layer, and the term "host material" refers to a material that is contained in the light-emitting layer four times as much as the guest material.

As a hole transporting material that can be used as the first host material for the light-emitting layer, besides the foregoing α-NPD, an organic compound having an aromatic amine skeleton is preferably used such as 4,4'-bis[N-(3-methylphenyl)-N-phenyl-amino]-biphenyl (abbreviated TPD), 4,4',4"-tris(N,N-diphenyl-amino)-triphenylamine (abbreviated TDATA), 4,4',4"-tris[N-(3-methylphenyl)-N-phenyl-amino]-triphenylamine (abbreviated MTDATA), 4,4',4"-tris[N-(1-naphthyl)-N-phenyl-amino]-triphenylamine (abbreviated 1-TNATA), and the like can be used. Further, a metal complex having an aromatic amine skeleton, tris(5-diphenylamino-8-hydroxyquinolinato)aluminum (abbreviated Al(daq)$_3$), bis(5-diphenylamino-8-hydroxyquinolinato)zinc (abbreviated Zn(daq)$_3$), a kind of an organometallic complex, tris(1-phenylpirazole)cobalt(III) (abbreviated Co(PPZ)$_3$), tris(1-(4-methylphenyl)pirazole)cobalt(III) (abbreviated Co(m-PPZ)$_3$), and the like, each of which also has a hole transportation property.

As a material having a large dipole moment that can be used as a second host material for the light-emitting layer, metal complexes such as the foregoing Alq$_3$, tris(5-methyl-8-quinolinolato)aluminum (abbreviated Almq$_3$), tris(8-quinolinolato)gallium (abbreviated Gaq$_3$), bis(10-hydroxybenz)[h]-quinolinato)beryllium (abbreviated BeBq$_2$), bis[2-(2-hydroxyphenyl)-benzooxazolate]zinc (abbreviated Zn(BOX)$_2$), and bis[2-(2-hydroxyphenyl)-benzothiazolate] zinc (abbreviated Zn(BTZ)$_2$) can be used. The second host material may have an electron transportation property.

The second host material for the light-emitting layer is not limited to the above described materials. An organic compound having a larger dipole moment than that of the first host material can be used. For example, α-NPD can be used as the first host material, and BAlq or the like having a larger dipole moment than that of the α-NPD can be used as the second host material.

On the other hand, as a guest material having an electron-withdrawing group in the light-emitting layer, a light-emitting material having an electron-withdrawing group such as cyano group, a halogeno group, a carbonyl group, and the like can be used. As a light-emitting material having a cyano group, besides coumarin 337, 4-(dicyanomethylene)-2-[p-(dimethylamino)styryl]-6-methyl-4H-pyran (abbreviated DCM1), 4-(dicyanomethylene)-2-methyl-6-(9-julolidyl) ethinyl-4H-pyran (abbreviated DCM2), 4-(dicyanomethylene)-2,6-bis[p-(dimethylamino-)styryl]-4H-pyran (abbreviated BisDCM), a material having 4-dicyanomethylene-4H-pyran skeleton such as the foregoing BisDCCz, or the like can be used. As a light-emitting material having a halogeno group, a light-emitting material having a haloalkyl group such as coumarin 152 or coumarin 153 is typically used. As a light-emitting material having a carbonyl group, a light-emitting material having an ester group such as coumarin 314, a light-emitting material having an acyl group such as coumarin 334, and a light-emitting material having a carboxyl group such as coumarin 343 or coumarin-3-carboxilic acid can be used.

Further, the present invention is not limited to the above described materials.

Hereinafter, an embodiment of a light-emitting element according to the invention is explained in detail. An electroluminescent layer of the light-emitting element according to the invention may comprise at least the foregoing light-emitting layer. Hence, the light-emitting layer may be formed by combining layers having properties except light-emission (a hole injecting layer, a hole transporting layer, an electron transporting layer, and an electron injecting layer) that are known in the conventional light-emitting element.

Figure 3:
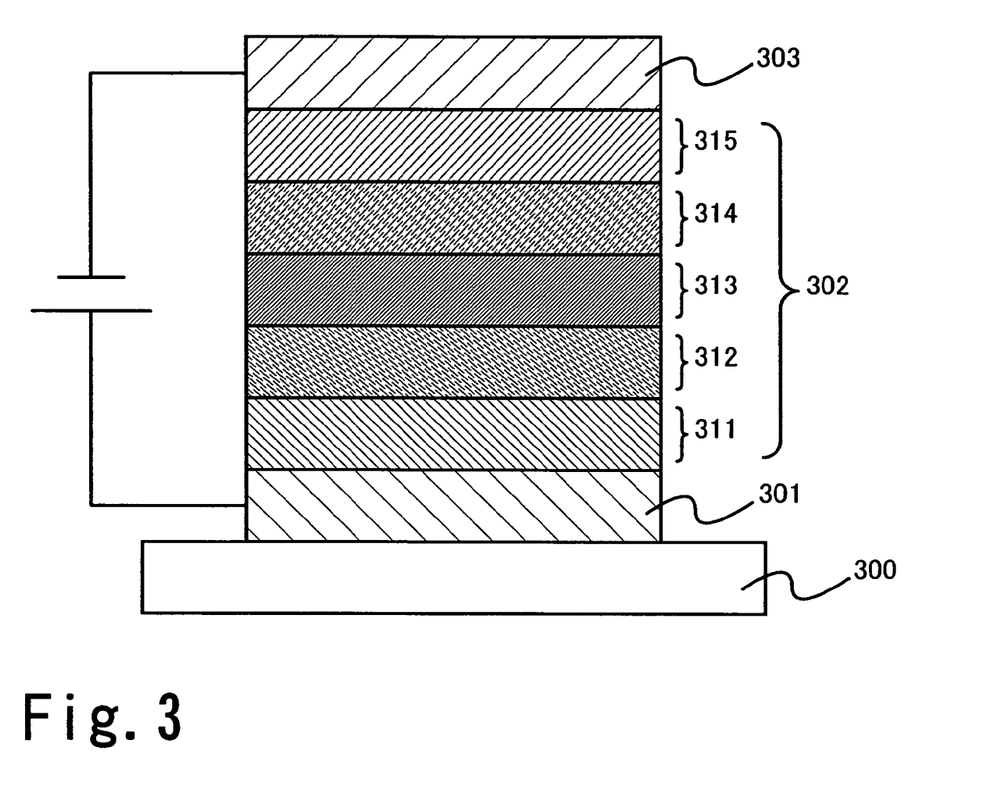
FIG. 3 is a view for showing a configuration of a light-emitting element according to the present invention.

In Embodiment 1, a configuration of a light-emitting element comprising a hole injecting layer, a hole transporting layer, a light-emitting layer, an electron transporting layer, and an electron injecting layer is explained with reference to FIG. 3. FIG. 3 shows a light-emitting element manufactured in accordance with the following procedure, that is, a first electrode 301 is formed over a substrate 300, an electroluminescent layer 302 is formed over the first electrode 301, and a second electrode 303 is formed over the electroluminescent layer 302.

As a material for the substrate 300, the material used for the conventional light-emitting element, for example, glass, quartz, transparent plastic, or the like, can be used.

Further, according to Embodiment 1, the first electrode 301 serves as an anode, and the second electrode 303 serves as a cathode.

As an anode material for the first electrode 301, metals having a large work function (specifically, at least 4.0 eV), alloys, electric conductive compounds, or a mixture of the above materials are preferably used. As a specific example of an anode material, in addition to ITO (indium tin oxide), IZO (indium zinc oxide) that is a mixture of indium oxide and zinc oxide (ZnO) of from 2 to 20%; aurum (Au); platinum (Pt); nickel (Ni); tungsten (W); chromium (Cr); molybdenum (Mo); iron (Fe); cobalt (Co); copper (Cu); palladium (Pd); metal nitrides (TiN or the like) can be used.

On the other hand, as a cathode material for the second electrode 303, metals having a small work function (specifically, at most 3.8 eV), alloys, electric conductive compounds, or a mixture of the above materials are preferably used. As a specific example of cathode materials, metals belonging to a 1 or 2 group of the periodic table of the elements, that is, alkali metals such as Li or Cs; alkali earth metals such as Mg, Ca, or Sr; alloys including the above elements (Mg:Ag, Al:Li); rare earth metals such as Er, or Yb; alloys including the rare earth metals; or the like can be used. In addition, the second electrode 303 can also be formed by metals or inorganic conductive compounds such as Al, Ag, or ITO by utilizing an electron injecting layer as will hereinafter be described.

The first electrode 301 and the second electrode 303 can be formed by vapor deposition, sputtering, or the like. These electrodes are preferably formed to have thicknesses of from 10 to 500 nm.

The light-emitting element according to the invention has the structure that light resulted from the recombination of carriers in the electroluminescent layer 302 is emitted to outside through either the first electrode 301 or the second electrode 303, or both of the electrodes. Therefore, the first electrode 301 is formed by a light-transmitting material in case of emitting light from the first electrode 301, and the second electrode 303 is formed by a light-transmitting material in case of emitting light from the second electrode 303.

The electroluminescent layer 302 is formed by stacking a plurality of layers. In Embodiment 1, the electroluminescent layer 302 is formed by stacking a hole injecting layer 311, a hole transporting layer 312, a light-emitting layer 313, an electron transporting layer 314, an electron injecting layer 315. These layers can be formed by vacuum vapor deposition or wet coating.

As a hole injecting material for the hole injecting layer 311, porphyrin compounds are useful among organic compounds such as phthalocyanine (abbreviated $H_2$-Pc), copper phthalocyanine (abbreviated Cu-Pc), or the like. Besides, 4,4'-bis[N-[4-{N,N-bis(3-methylphenyl)amino}phenyl]-N-phenylamino]biphenyl (abbreviated DNTPD), or the like can be used as organic compounds. Further, chemical-doped conductive polymer compounds can be used, such as polyethylene dioxythiophene (abbreviated PEDOT) doped with polystyrene sulfonate (abbreviated PSS), or polyaniline (PAni). Alternatively, an inorganic semiconductor layer such as $Vo_x$, or $MoO_x$, or a ultra thin film of inorganic insulator such as $Al_2O_3$.

As a hole transporting material for the hole transporting layer 312, the foregoing α-NPD, TPD, TDATA, MTDATA, 1-TNATA, $Al(daq)_3$, $Zn(daq)_3$, $Co(PPZ)_3$, $Co(m-PPZ)_3$, or the like can be used.

The light-emitting layer 313 includes at least the first host material having a hole transportation property, the second host material having a large dipole moment, and the guest material having an electron-withdrawing group. As the first host material having a hole transportation property, the foregoing hole transporting material can be used. As the second host material having a large dipole moment, the foregoing $Alq_3$, $Almq_3$, $Gaq_3$, $BeBq_2$, $Zn(BOX)_2$, $Zn(BTZ)_2$, or the like can be used. As the guest material having an electron-withdrawing group, the foregoing DCM1, DCM2, BisDCM, BisDCCz, coumarin 337, coumarin 152, coumarin 153, coumarin 314, coumarin 334, coumarin 343, coumarin-3-carboxylic acid, or the like can be used.

Further, an assist dopant material (for example, rubrene) may be added to the light-emitting layer 313 to prevent the host material from emitting light.

As an electron transporting material for forming an electron transporting layer 314, metal complexes such as the foregoing $Alq_3$, $Almq_3$, bis (2-methyl-8-quinolinolato)-4-phenylphenolato-aluminum (abbreviated BAlq), $Gaq_3$, bis(2-methyl-8-quinolinolato)-4-phenylphenolato-gallium (abbreviated BGaq), $BeBq_2$, $Zn(BOX)_2$, and $Zn(BTZ)_2$. Besides, 2-(4-biphenylyl)-5-(4-tert-butylphenyl)-1,3,4-oxadiazole (abbreviated PBD), and 1,3-bis[5-(p-tert-butylphenyl)-1,3,4-oxadiazole-2-yl]benzene (abbreviated OXD-7), 3-(4-tert-butylphenyl)-4-phenyl-5-(4-biphenylyl)-1,2,4-triazole (abbreviated TAZ), and 3-(4-tert-butylphenyl)-4-(4-ethylphenyl)-5-(4-biphenylyl)-1,2,4-triazole (abbreviated p-EtTAZ), bathophenanthroline (abbreviated BPhen), bathocuproin (abbreviated BCP), and the like can be used.

As an electron injecting material for the electron injecting layer 315, the foregoing electron transporting material can be used. Alternatively, an ultra thin film of insulator, for example, alkali metal halides such as LiF or CsF, alkali earth metal halides such as $CaF_2$, or alkali metal oxides such as $LiO_2$ is frequently used. Alternatively, alkali metal complexes such as lithium acetylacetonate (abbreviated Li(acac)) or 8-quinolinolato-lithium (abbreviated Liq) can be effectively used. Further, a layer formed by mixing the foregoing electron transporting material and metals having a small work function such as Mg, Li, or Cs can be used as the electron injecting layer 315.

Accordingly, a light-emitting element according to the invention can be manufactured that comprises the light-emitting layer 313 containing the first host material with a hole transportation property, the second host material with a large dipole moment, and the guest material with an electron-withdrawing group; and the electron transporting layer 314 formed on the light-emitting layer 313.

The hole transporting material for forming the hole transporting layer and the hole transporting material used as the first host material may be the same or different. The electron transporting material for forming the electron transporting layer and the material having a large dipole moment used as the second host material may be the same or different.

According to the above described configuration, a driving voltage of a light-emitting element manufactured by a doping system can be reduced. Especially, a driving voltage of a light-emitting element doped with a red light-emitting material as a guest material can be reduced. Further, color purity can be improved as well as reduced a driving voltage. Especially, color purity of a light-emitting element doped with a red light-emitting material as a guest material can be improved as well as reduced a driving voltage.

Example 1

In Example 1, an example of a method for manufacturing a light-emitting element according to the present invention illustrated in FIG. 3 is explained specifically.

An anode 301 was formed over a glass substrate 300 having an insulated surface. As a material for the anode 301, ITO that is a transparent conductive film was used. The anode 301 was formed to have a thickness of 110 nm by sputtering. The size of the anode 301 was 2×2 mm.

After washing and drying the substrate provided with the anode 301, an electroluminescent layer 302 was formed over the anode 301. Firstly, the surface of substrate provided with the anode 301 was secured face down by a substrate holder installed in a vacuum deposition device. Then, Cu-Pc was deposited to have a thickness of 20 nm by vacuum vapor deposition with resistance heating. The deposited film serves as a hole injecting layer 311. Secondly, α-NPD that is a hole transporting material was deposited to have a thickness of 40 nm in accordance with the same procedure as that for the hole injecting layer. The deposited film serves as a hole transporting layer 312.

α-NPD was used as a first host material having a hole transportation property. $Alq_3$ was used as a second host material having a large dipole moment. BisDCM was used as a guest material having an electron-withdrawing group. Rubrene was used as assist dopant to prevent the host material from emitting light. A light-emitting layer 313 was formed by co-evaporation of the foregoing materials to have a weight ratio of 1:1:0.02:0.02, sequentially. The light-emitting layer 313 was formed to have a thickness of 37.5 nm.

Then, $Alq_3$ that is an electron transporting material was deposited to form an electron transporting layer 314 with a thickness of 37.5 nm by vacuum vapor deposition. And then, $CaF_2$ was deposited as an electron injecting layer 315 with a thickness of 1 nm by vacuum vapor deposition. Thus formed hole injecting layer 311, the hole transporting layer 312, the light-emitting layer 313, the electron transporting layer 314, and the electron injecting layer 315 serve as an electroluminescent layer 302. The electroluminescent layer 302 has a total thickness of 136 nm.

Lastly, a cathode 303 was formed. According to Example 1, aluminum (Al) was deposited to have a thickness of 200 nm as the cathode 303 by vacuum vapor deposition with resistance heating.

A light-emitting element manufactured according to Example 1 is denoted by a light-emitting element 1. The light-emitting element 1 required a driving voltage of 8.4 V to emit light at 100 cd/m$^2$. The light-emitting element 1 emitted light at a luminance of 100 cd/m$^2$ with the CIE chromaticity coordinates x=0.63, y=0.36.

Example 2

α-NPD was used as a first host material having a hole transportation property. Alq$_3$ was used as a second host material having a large dipole moment. BisDCM was used as a guest material having an electron-withdrawing group. Rubrene was used as assist dopant to prevent the host material from emitting light. A light-emitting layer 313 was formed by co-evaporation of the foregoing materials to have a weight ratio of 0.5:1:0.02:0.02, sequentially. The other layers were formed in accordance with Example 1.

Figure 4:
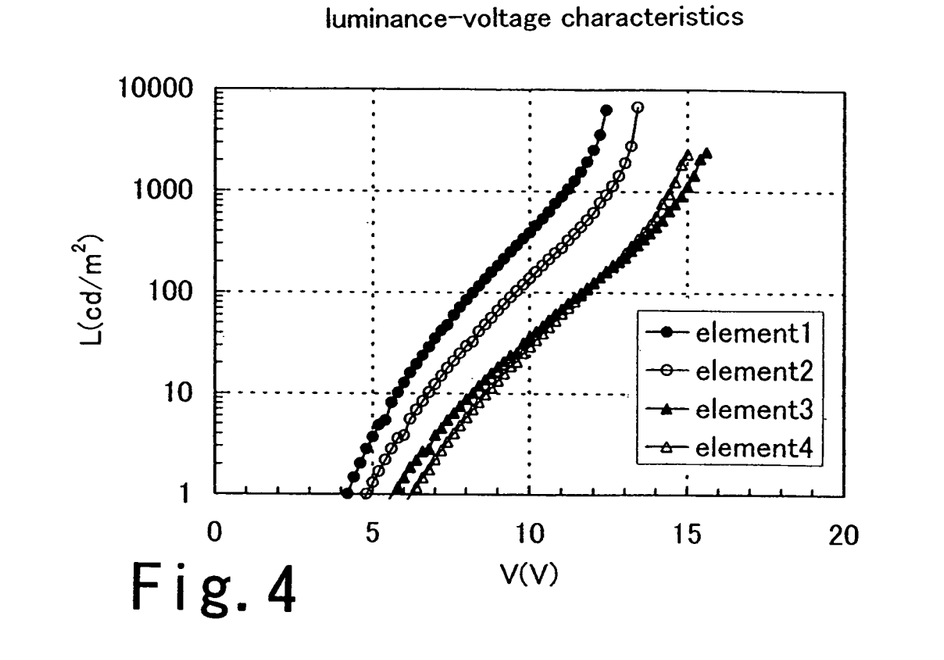
FIG. 4 is a graph for showing luminance-voltage characteristics of light-emitting elements manufactured according to Examples 1 and 2, and Comparative Examples 1 and 2.

A light-emitting element manufactured according to Example 2 is denoted by a light-emitting element 2. FIG. 4 shows luminance-voltage characteristics of the light-emitting element 2. The light-emitting element 2 required a driving voltage of 9.6 V to emit light at 100 cd/m$^2$. The light-emitting element 2 emitted light at a luminance of 100 cd/m$^2$ with the CIE chromaticity coordinates x=0.64, y=0.35.

Comparative Example 1

As a comparative example, a light-emitting element was formed to have a light-emitting layer 313 containing a small amount of a hole transporting material. That is, the light-emitting layer 313 is formed so that the hole transporting material does not serve as a host material. The light-emitting element was compared to those explained in Examples 1 and 2.

α-NPD was used as the small amount of hole transporting material. Alq$_3$ was used as a second host material having a large dipole moment. BisDCM was used as a guest material having an electron-withdrawing group. Rubrene was used as assist dopant to prevent the host material from emitting light. A light-emitting layer 313 was formed by co-evaporation of the foregoing materials to have a weight ratio of 0.06:1:0.02:0.02, sequentially. The other layers were formed in accordance with Example 1.

A light-emitting element manufactured according to Comparative Example 1 is denoted by a light-emitting element 3. FIG. 4 shows luminance-voltage characteristics of the light-emitting element 3. The light-emitting element 3 required a driving voltage of 11.8 V to emit light at 100 cd/m$^2$. The light-emitting element 3 emitted light at a luminance of 100 cd/m$^2$ with the CIE chromaticity coordinates x=0.65, y=0.34.

Comparative Example 2

As a comparative example, the conventional light-emitting element having a light-emitting layer formed by an electron transporting material added with a guest material having an electron-withdrawing group was manufactured. The light-emitting element was compared to those explained in Examples 1 and 2.

Alq$_3$ was used as an electron transporting material. BisDCM was used as a guest material having an electron-withdrawing group. Rubrene was used as assist dopant to prevent the host material from emitting light. A light-emitting layer 313 was formed by co-evaporation of the foregoing materials to have a weight ratio of 1:0.02:0.02, sequentially. The other layers were formed in accordance with Example 1.

A light-emitting element manufactured according to Comparative Example 2 is denoted by a light-emitting element 4. FIG. 4 shows luminance-voltage characteristics of the light-emitting element 4. The light-emitting element 4 required a driving voltage of 11.8 V to emit light at 100 cd/m$^2$ with the CIE chromaticity coordinates x=0.65, y=0.34.

Figure 5:
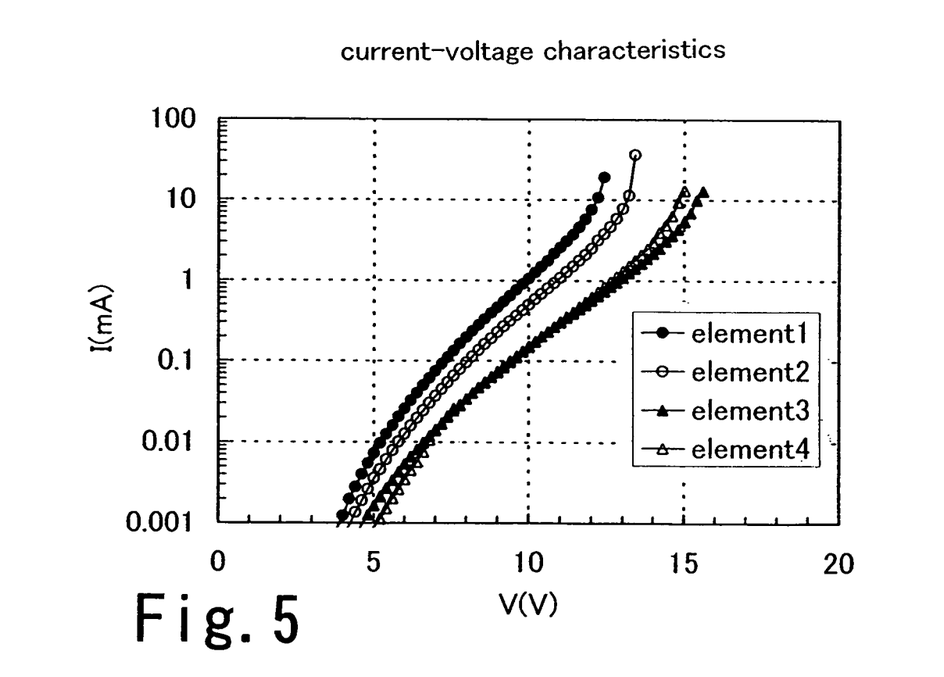
FIG. 5 is a graph for showing current-voltage characteristics of light-emitting elements manufactured according to Examples 1 and 2, and Comparative Examples 1 and 2.

FIG. 5 shows current-voltage characteristics of the light-emitting elements 1 to 4. FIG. 5 shows that current becomes easier to flow in the light-emitting elements 1 and 2 compared to that in the light-emitting elements 3 and 4. Accordingly, it can be considered that current can be flowed easily by adding a first host material having a hole transportation property to a light-emitting layer that is one aspect of the present invention.

The luminance-voltage characteristics of the light-emitting elements 1 to 4 illustrated in FIG. 4 shows that luminance of the light-emitting elements 1 and 2 manufactured according to the present invention is more improved at a constant voltage than that of the light-emitting elements 3 and 4 manufactured by the conventional method. That is, a driving voltage is decreased. Based on the fact that the luminance-voltage characteristics between the light-emitting elements 3 and 4 are hardly different from each other, the first host material having a hole transportation property is required to account for 20% or more, preferably, 30% or more of the total weight of host materials to obtain an effect of reducing a driving voltage.

The CIE chromaticity coordinates of the light-emitting elements 1 and 2 manufactured according to the present invention are hardly different from those of the light-emitting elements 3 and 4 manufactured by the conventional method. Therefore, it can be known that the light-emitting elements 1 and 2 can emit reddish light emission with good color purity.

Figure 6:
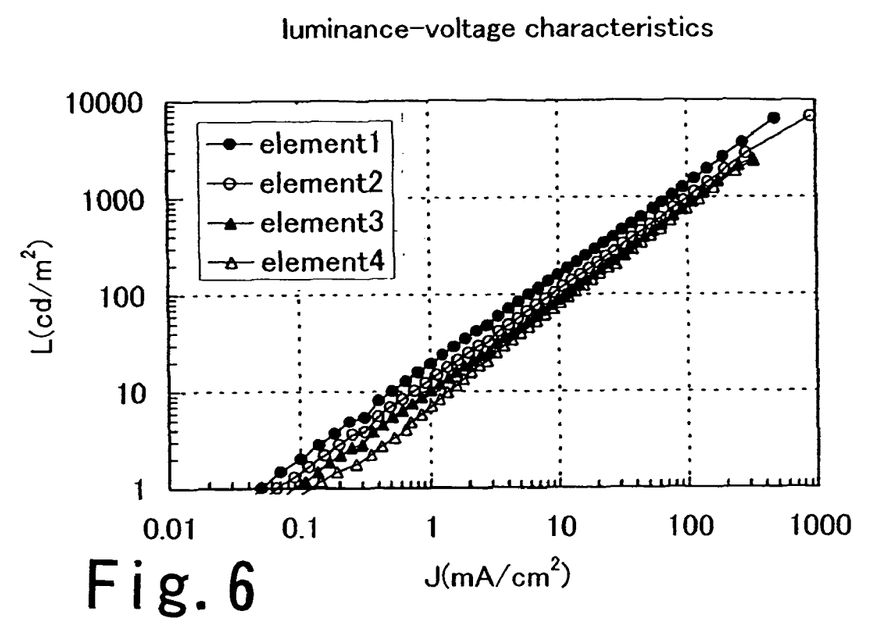
FIG. 6 is a graph for showing luminance-current density characteristics of light-emitting elements manufactured according to Examples 1 and 2, and Comparative Examples 1 and 2.
Figure 7:
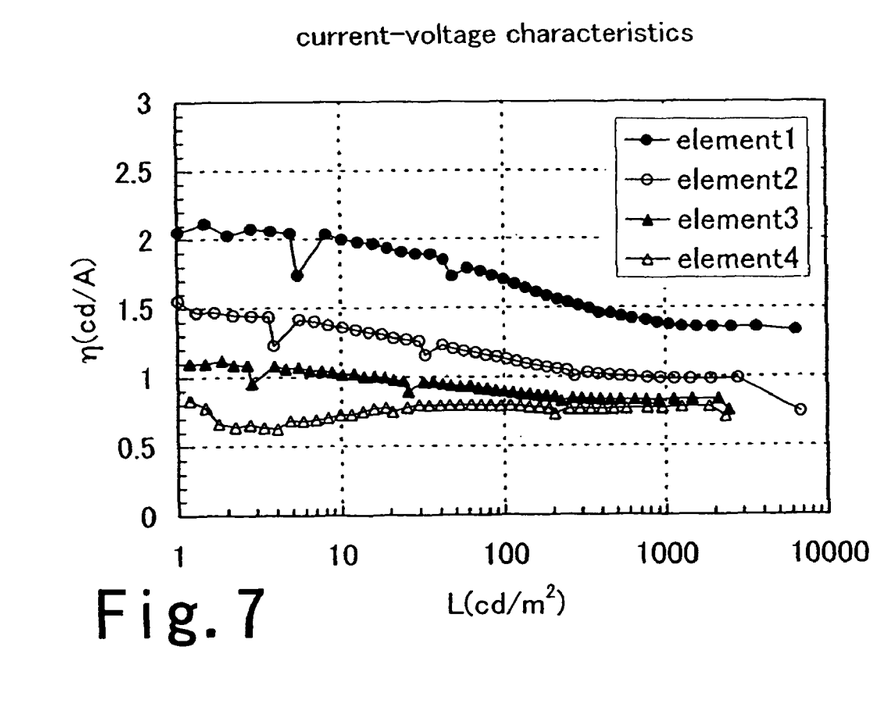
FIG. 7 is a graph for showing current efficiency-luminance characteristics of light-emitting elements manufactured according to Examples 1 and 2, and Comparative Examples 1 and 2.

FIG. 6 shows luminance-current density characteristics of the light-emitting elements 1 to 4. FIG. 7 shows current efficiency-luminance characteristics of the light-emitting elements 1 to 4. FIGS. 6 and 7 show that emission efficiency of the light-emitting elements 1 and 2 is more improved than that the light-emitting elements 3 and 4. Conventionally, the emission efficiency of a light-emitting element added with a red light-emitting material as a guest material is often lower than that of a light-emitting element added with another light-emitting material exhibiting another color as a guest material. By practicing the present invention, it is revealed that emission efficiency of a light-emitting element added with a red light-emitting material as a guest material can be improved.

As described above, color purity of a light-emitting element manufactured by a doping system can be improved as well as reduced a driving voltage. Moreover, emission efficiency of the light-emitting element can be improved.

Example 3

An example of manufacturing a light-emitting element by using a guest material having an electron-withdrawing group different from that explained in Examples 1 and 2 is specifically explained in Example 3. FIG. 3 shows the configuration of the light-emitting element.

An anode 301 was formed over a glass substrate 300 having an insulating surface. The anode 301 was formed by ITO that is a transparent conductive film to have a thickness of 110 nm by sputtering. The anode 301 was formed to have a size of 2×2 mm.

After washing and drying the substrate provided with the anode 301, an electroluminescent layer 302 was formed over the anode 301. Firstly, the surface of the substrate provided with the anode 301 was secured face down by a substrate holder installed in a vacuum deposition device. Then, 4,4'-bis [N-[4-{N,N-bis(3-methylphenyl)amino}phenyl]-N-phenylamino]biphenyl (abbreviated DNTPD) was deposited to have a thickness of 50 nm by vacuum vapor deposition with resistance heating. The deposited film serves as a hole injecting layer 311. Secondly, α-NPD that is a hole transporting material was deposited to have a thickness of 10 nm by vacuum vapor deposition with resistance heating. The deposited film serves as a hole transporting layer 312.

A light-emitting layer 313 was formed by co-evaporation of α-NPD, which has a dipole moment of 0.863 debye calculated by commercially available molecular orbital calculation software, WinMOPAC3.5 (FUJITSU LIMITED), as a first host material having a hole transportation property; BAlq, which has a dipole moment of 1.297 debye calculated by commercially available molecular orbital calculation software, WinMOPAC3.5 (FUJITSU LIMITED), as a second host material having a larger dipole moment than that of the first host material; and coumarin 334 as a guest material having an electron-withdrawing group to have a weight ratio of 1:1:0.005, sequentially. The light-emitting layer 313 was formed to have a thickness of 30 nm. The coumarin 334 is a compound including a carbonyl group, which is an electron-withdrawing group, since the coumarin 334 includes an acetyl group, which is a type of an acyl group.

An electron transporting layer 314 was formed by vacuum vapor deposition of BAlq that is an electron transporting material with 10 nm in thick, and $Alq_3$ that is an electron transporting material with 20 nm in thick. An electron injecting layer 315 was formed by $CaF_2$ by vacuum vapor deposition to have a thickness of 1 nm. Thus formed hole injecting layer 311, hole transporting layer 312, light-emitting layer 313, electron transporting layer 314, and electron injecting layer 315 serve as an electroluminescent layer 302 with a total thickness of 121 nm.

Lastly, a cathode 303 was formed. In Example 3, the cathode 303 was formed by aluminum (Al) by vacuum vapor deposition with resistance heating to have a thickness of 150 nm.

Thus manufactured light-emitting element according to the present invention required voltage of 8.2 V to obtain luminance of 1000 $cd/m^2$. The emission spectrum has a peak at 487 nm.

Comparative Example 3

The conventional light-emitting element is formed that has a light-emitting layer formed by an electron transporting material added with a guest material having an electron-withdrawing group to compare to the light-emitting element explained in Example 3. The configuration of the light-emitting element is the same except a light-emitting layer 313.

The light-emitting layer 313 according to Comparative Example 3 was formed by co-evaporation of BAlq that is an electron transporting material as a host material; and coumarin 334 having an electron-withdrawing group that was also used in Example 3 as a guest material to have a weight ratio of 1:0.005, sequentially. The light-emitting layer 313 was formed to have a thickness of 30 nm. An electroluminescent layer 302 has a total thickness of 121 nm, which is the same as that in Example 3.

Thus manufactured light-emitting element according to the present invention required voltage of 9.4 V to obtain luminance of 1000 $cd/cm^2$. The emission spectrum has a peak at 487 nm.

Figure 10:
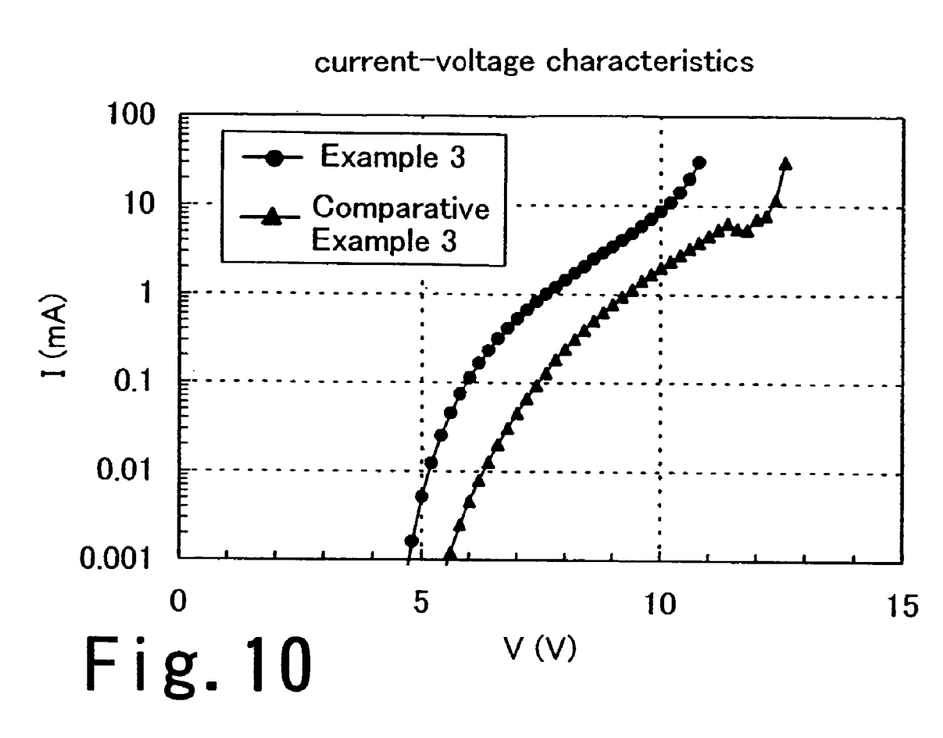
FIG. 10 shows current-voltage characteristics of light-emitting elements manufactured according to Example 3 and Comparative Example 3.

Therefore, the light-emitting element according to the present invention has the same peak wavelength of an emission spectrum as that of the conventional light-emitting element, and operates at a lower driving voltage. FIG. 10 shows current-voltage characteristics of the light-emitting elements according to Example 3 and Comparative Example 3. FIG. 10 shows that the practice of the present invention allows current to flow easily.

Example 4

A method for manufacturing a light-emitting element formed by a guest material having an electron-withdrawing group different from that in Examples 1, 2, and 3 is specifically explained. The configuration of the light-emitting element is the same as that in Example 3 except a light-emitting layer 313.

The light-emitting layer 313 is formed by co-evaporation of α-NPD having a hole transporting property as a first host material, BAlq having a larger dipole moment than that of the first host material as a second host material, and coumarin 153 having an electron-withdrawing group as a guest material to have a weight ratio of 1:1:0.005, sequentially. The light-emitting layer 313 is formed to have a thickness of 30 nm. The total thickness of an electroluminescent layer 302 is 121 nm. The coumarin 153 is a compound including a halogeno group (fluoro group in Example 4), since the coumarin 153 includes a trifluoromethyl group, which is a type of a haloalkyl group.

Thus manufactured light-emitting element according to the present invention required voltage of 8.8 V to obtain luminance of 1000 $cd/cm^2$. The emission spectrum has a peak at 520 nm.

Comparative Example 4

The conventional light-emitting element is formed that has a light-emitting layer formed by an electron transporting material added with a guest material having an electron-withdrawing group to compare to the light-emitting element explained in Example 4. The configuration of the light-emitting element is the same as that explained in Example 4 except a light-emitting layer 313.

The light-emitting layer 313 according to Comparative Example 4 was formed by co-evaporation of BAlq that is an electron transporting material as a host material; and coumarin 153 that was also used in Example 4 having an electron-withdrawing group as a guest material to have a weight ratio of 1:0.005, sequentially. The light-emitting layer 313 was formed to have a thickness of 30 nm. An electroluminescent layer 302 has a total thickness of 121 nm, which is the same as that in Example 4.

Thus manufactured light-emitting element according to the present invention required voltage of 9.6 V to obtain luminance of 1000 $cd/cm^2$. The emission spectrum has a peak at 528 nm.

Figure 11:
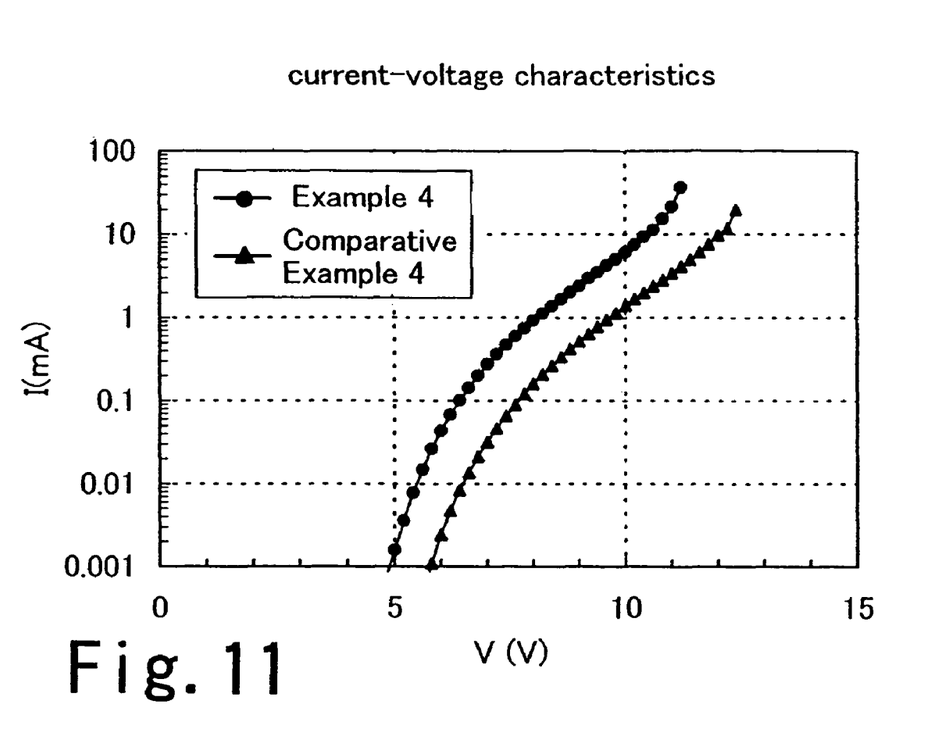
FIG. 11 shows current-voltage characteristics of light-emitting elements manufactured according to Example 4 and Comparative Example 4.

Therefore, the light-emitting element according to the present that has a slightly blue-shifted peak wavelength of an emission spectrum, and operates at a lower driving voltage. FIG. 11 shows current-voltage characteristics of the light-emitting elements according to Example 4 and Comparative Example 4. FIG. 11 shows that the practice of the present invention allows current to flow easily.

Example 5

Figure 8A:
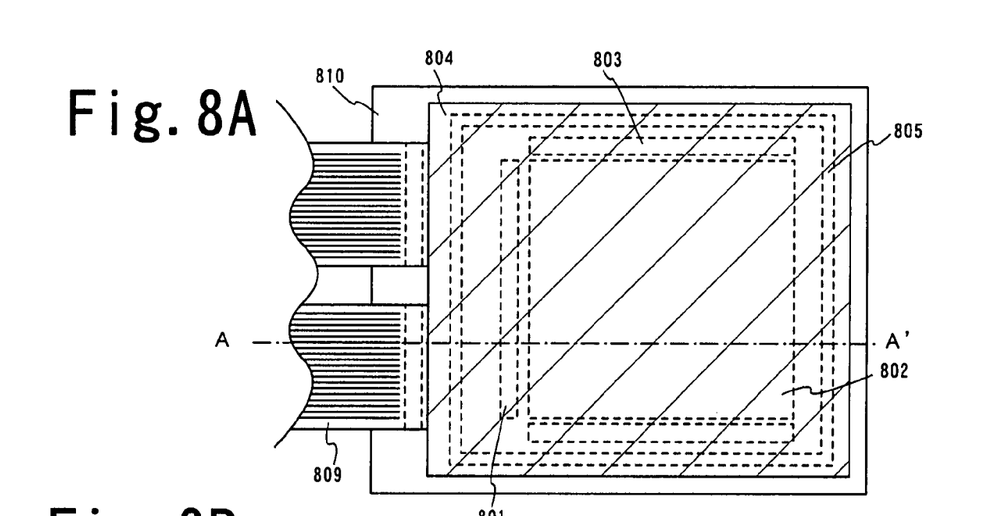
FIG. 8A and FIG. 8B are explanatory views for showing a light-emitting device using a light-emitting element according to the present invention.
Figure 8B:
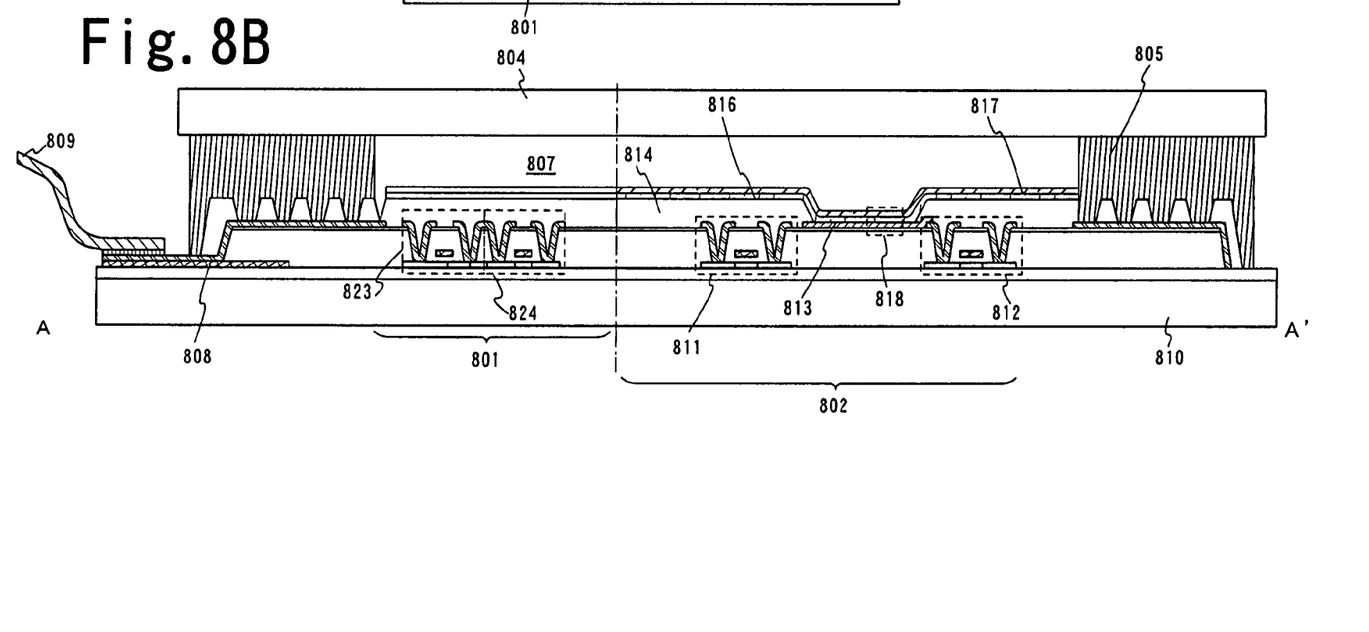

Hereinafter, a light-emitting device that has a pixel portion including light-emitting elements according to the present invention will be explained with reference to FIGS. 8A and 8B. FIG. 8A is a top view of the light-emitting device. FIG. 8B is a cross-sectional view of FIG. 8A taken along line A-A'. Reference numeral 801 shown by a dotted line denotes a drive circuit portion (a source driver circuit); 802, a pixel portion;

and 803, a driver circuit portion (a gate side driver circuit). Further, reference numeral 804 denotes a sealing substrate; 805, sealing agent; and 807, space surrounded by the sealing agent 805.

Further, reference numeral 808 denotes a wiring for transmitting signals to be inputted to the source signal line driver circuit 801 and the gate signal line driver circuit 803. The wiring 808 receives video signals, clock signals, start signals, reset signals, and the like from an FPC (Flexible Print Circuit) 809 serving as an external input terminal. Though only the FPC is illustrated here, the FPC can be provided with a print wiring board (PWB). The light-emitting device disclosed in this specification refers to not only a light-emitting device itself but also a light-emitting device provided with an FPC or a PWB.

Then, the cross-sectional structure is explained with reference to FIG. 8B. A driver circuit portion and a pixel portion are formed over a substrate 810. Here, a source driver circuit 801 as a driver circuit portion and a pixel portion 802 are illustrated.

In the source driver circuit 801, a CMOS circuit composed of an n-channel TFT 823 and a p-channel TFT 824 is formed. The TFT for forming a driver circuit may be formed by a known CMOS circuit, PMOS circuit, or NMOS circuit. In this embodiment, a driver integrated type in which a driver circuit is formed over a substrate, but not exclusively, is described. The driver circuit can also be formed outside instead of over a substrate.

The pixel portion 802 is composed of a plurality of pixels including a switching TFT 811, a current control TFT 812, and a first electrode 813 connected electrically to the drain of the current control TFT 812. Further, an insulator 814 is formed to cover the edge of the first electrode 813. Here, the insulator 814 is formed by a positive type photosensitive acrylic resin film.

To improve the coverage, the upper edge portion or the lower edge portion of the insulator 814 is formed to have a curved surface having a radius of curvature. For example, when a positive photosensitive acrylic resin film is used for forming the insulator 814, it is preferable that only the upper edge portion of the insulator 814 is formed to have a curved surface having a radius of curvature (0.2 to 3 µm). As materials for the insulator 814, either a negative type photosensitive resin that becomes insoluble to etchant by light or a positive type photosensitive resin that becomes dissoluble to etchant by light can be used.

An electroluminescent layer 816 and a second electrode 817 are formed over the first electrode 813, respectively. As a material for the first electrode 813 serving as an anode, a material having a large work function is preferably used. For instance, the first electrode can be formed by a single layer such as an ITO (indium tin oxide) film, an IZO (indium zinc oxide) film, a titanium nitride film, a chromic film, a tungsten film, a Zn film, or a Pt film; a lamination layer comprising the foregoing single layer and a titanium nitride and aluminum as its main component; a three lamination layer comprising a titanium nitride film, a film containing aluminum as its main component, and another titanium nitride film; or the like. In case of adopting the lamination layer, the first electrode can be formed to have low resistance as a wiring, make good ohmic contact, and serve as an anode.

The electroluminescent layer 816 is formed by vapor deposition using an evaporation mask, or ink jetting. The electroluminescent layer 816 may be formed to have the same structure as that explained in Examples 1 and 2.

As materials for the second electrode (cathode) 817 formed over the electroluminescent layer 816, materials having a small work function (Al, Ag, Li, Ca, or alloys of these elements such as MgAg, MgIn, AlLi, $CaF_2$, or CaN) can be used. In case that light generated in the electroluminescent layer 816 passes through the second electrode (cathode) 817, the second electrode (cathode) 817 is preferably formed by a lamination layer comprising a thin metal film and a transparent conductive film (indium tin oxide (ITO), indium zinc oxide (IZO), zinc oxide (ZnO), or the like).

The sealing substrate 804 is pasted onto the substrate 810 with the sealing agent 805 to encapsulate an electroluminescent device 818 within the space 807 surrounded by the substrate 810, the sealing substrate 804, and the sealing agent 805. The space 807 may be filled with inert gases (such as nitrogen or argon). Alternatively, the space 807 may be filled with the sealing agent 805.

The sealing agent 805 is preferably formed by epoxy-based resin. In addition, it is desirable that the material for the sealing agent inhibits the penetration of moisture or oxygen as much as possible. As materials for the sealing substrate 804, a plastic substrate such as FRP (fiberglass-reinforced plastics), PVF (polyvinyl fluoride), Myler, polyester, or acrylic can be used besides a glass substrate or a quartz substrate.

Accordingly, a light-emitting device comprising a light-emitting element according to the invention can be obtained.

Example 6

Various electric appliances including a light-emitting device with a light-emitting element according to the present invention as a display portion can be provided.

Given as examples of such electric appliances including a light-emitting device with a light-emitting element according to the invention: a video camera, a digital camera, a goggle-type display (head mount display), a navigation system, a sound reproduction device (a car audio equipment, an audio set and the like), a laptop personal computer, a game machine, a personal digital assistant (a mobile computer, a cellular phone, a portable game machine, an electronic book, or the like), an image reproduction device including a recording medium (more specifically, a device which can reproduce a recording medium such as a digital versatile disc (DVD) and so forth, and includes a display for displaying the reproduced image), or the like. FIGS. 9A to 9G show various specific examples of such electric appliances.

Figure 9A:
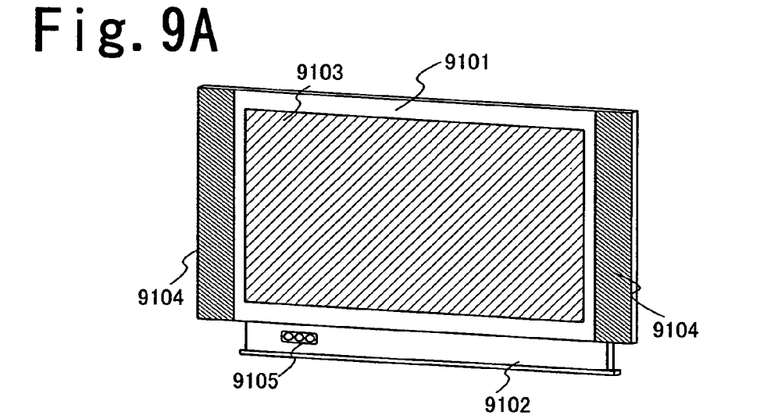
FIGS. 9A to 9E are explanatory views for showing electric appliances using a light-emitting element according to the present invention.

FIG. 9A illustrates a TV reception set which includes a housing 9101, a support base 9102, a display portion 9103, a speaker portion 9104, a video input terminal 9105, or the like. A light-emitting device including a light-emitting element according to the invention can be used for the display portion 9103. The TV reception set refers to all of the display devices for displaying information, such as a personal computer, a receiver of TV broadcasting, and an advertising display.

Figure 9B:
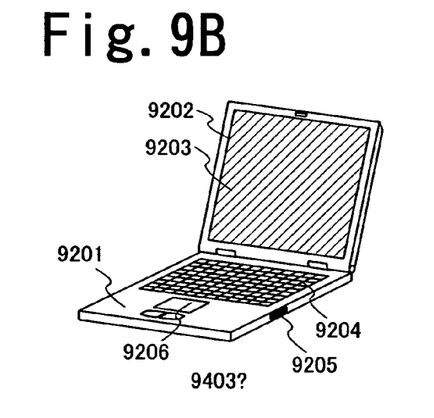

FIG. 9B illustrates a laptop computer which includes a main body 9201, a housing 9202, a display portion 9203, a keyboard 9204, an external connection port 9205, a pointing mouse 9206, or the like. A light-emitting device including a light-emitting element according to the invention can be used to the display portion 9203.

Figure 9C:
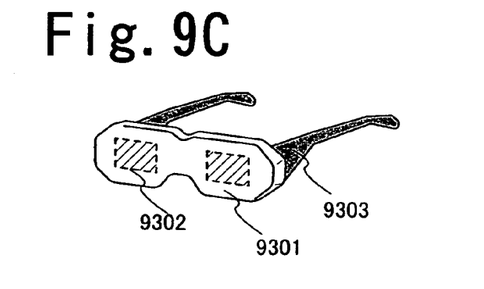

FIG. 9C illustrates a goggle type display (head mounted display), which includes a main body 9301, a display portion 9302, and an arm portion 9303. A light-emitting device including a light-emitting element according to the invention can be used to the display portion 9302.

Figures 9D, 9E:
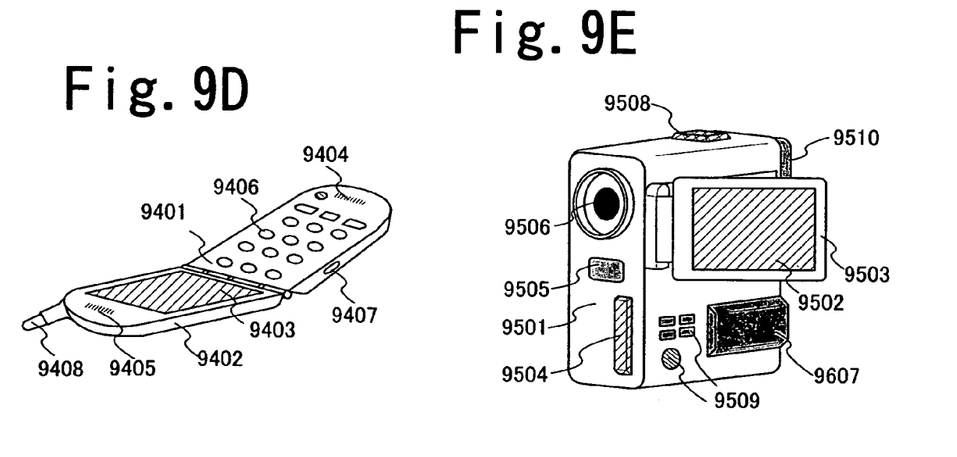

FIG. 9D illustrates a cellular phone which includes a main body 9401, a housing 9402, a display portion 9403, a sound input portion 9404, a sound output portion 9405, an operation key 9406, an external connecting port 9407, an antenna 9408, or the like. A light-emitting device including a light-emitting element according to the invention can be used to the display portion 9403. Note that the display portion 9403 can reduce power consumption of the cellular phone by displaying white-colored characters on a black-colored background.

FIG. 9E illustrates a video camera which includes a main body 9501, a display portion 9502, a housing 9503, an external connecting port 9504, a remote control receiving portion 9505, an image receiving portion 9506, a battery 9507, a sound input portion 9508, an operation key 9509, an eyepiece potion 9510, or the like. A light-emitting device including a light-emitting element according to the invention can be used to the display portion 9502.

As set forth above, a light-emitting device including a light-emitting element according to the invention can be applied variously to a wide range of electric appliances. The light-emitting device can be applied to various fields' electric appliances. By using the light-emitting element according to the invention, a driving voltage can be reduced and red emission with good color purity can be obtained.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A light-emitting element having a light-emitting layer comprising:
   a first host material that is an organic compound having a hole transportation property;
   a second host material that is an organic compound having a larger dipole moment than that of the first host material; and
   a guest material having an electron-withdrawing group, wherein the electron-withdrawing group is only a halogeno group.

2. A light-emitting element according to claim 1, wherein the first host material accounts for 20% or more to 60% or less of total weight of the first host material, the second host material, and the guest material.

3. A light-emitting element according to claim 1, wherein the guest material accounts for 5% or less of total weight of the first host material, the second host material, and the guest material.

4. A light-emitting element according to claim 1, wherein the first host material is an organic compound having an aromatic amine skeleton.

5. A light-emitting element according to claim 1, wherein the second host material has a dipole moment of 4 debye or more.

6. A light-emitting element according to claim 1, wherein the second host material is a metallic complex.

7. A light-emitting element according to claim 1, wherein an emission spectrum of the guest material has a peak wavelength in a range between 560 nm to 700 nm.

8. A light-emitting device having a light-emitting element according to claim 1.

9. An electric appliance having the light-emitting device according to claim 8.

10. A light-emitting element according to claim 1, further comprising an assist dopant.

11. A light-emitting element according to claim 1, further comprising an electron transport layer and a hole transport layer,
    wherein the light-emitting layer comprises a carrier recombination region disposed adjacent the electron transport layer to increase current flow and to decrease voltage.

12. A light-emitting element according to claim 1,
    wherein the light-emitting element is formed over a first electrode,
    wherein an insulator is formed to cover an edge of the first electrode, and
    wherein at least one of an upper edge portion and an lower edge portion of the insulator has a curved surface having a radius of curvature.

13. A light-emitting element according to claim 1,
    wherein the light-emitting element is formed over a first electrode,
    wherein an insulator having an upper edge portion and an lower edge portion is formed to cover an edge of the first electrode, and
    wherein only the upper edge portion of the insulator has a curved surface having a radius of curvature.

14. A light-emitting element according to claim 13,
    wherein the radius of curvature is in a range of 0.2 to 3 µm.

15. A light-emitting element having a light-emitting layer comprising:
    a first carrier transporting material that is an organic compound having a hole transportation property;
    a second carrier transporting material that is an organic compound having a larger dipole moment than that of the first carrier transporting material; and
    a light emitter having an electron-withdrawing group,
    wherein the electron-withdrawing group is only a halogeno group.

16. A light-emitting element according to claim 15, wherein the first carrier transporting material accounts for 20% or more to 60% or less of total weight of the first carrier transporting material, the second carrier transporting material, and the light emitter.

17. A light-emitting element according to claim 15, wherein the light emitter accounts for 5% or less of total weight of the first carrier transporting material, the second carrier transporting material, and the light emitter.

18. A light-emitting element according to claim 15, wherein the first carrier transporting material is an organic compound having an aromatic amine skeleton.

19. A light-emitting element according to claim 15, wherein the second carrier transporting material has a dipole moment of 4 debye or more.

20. A light-emitting element according to claim 15, wherein the second carrier transporting material is a metallic complex.

21. A light-emitting element according to claim 15, wherein an emission spectrum of the light emitter has a peak wavelength in a range between 560 nm to 700 nm.

22. A light-emitting device having a light-emitting element according to claim 15.

23. An electric appliance having the light-emitting device according to claim 22.

24. A light-emitting element according to claim 15, further comprising an assist dopant.

25. A light-emitting element according to claim 15, further comprising an electron transport layer and a hole transport layer,
    wherein the light-emitting layer comprises a carrier recombination region disposed adjacent the electron transport layer to increase current flow and to decrease voltage.

* * * * *